(12) United States Patent
Cohn

(10) Patent No.: US 6,509,642 B1
(45) Date of Patent: Jan. 21, 2003

(54) INTEGRATED CIRCUIT PACKAGE

(75) Inventor: Charles Cohn, Wayne, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/628,067

(22) Filed: Jul. 28, 2000

(51) Int. Cl.[7] .............................................. H01L 23/34
(52) U.S. Cl. ...................................... 257/712; 257/778
(58) Field of Search ................................ 257/712, 720, 257/686, 778

(56) References Cited

U.S. PATENT DOCUMENTS

| | | | |
|---|---|---|---|
| 5,294,826 A | | 3/1994 | Marcantonio et al. |
| 5,650,593 A | * | 7/1997 | McMillan et al. ........... 257/720 |
| 5,814,883 A | * | 9/1998 | Sawa et al. .................. 257/720 |
| 5,894,166 A | | 4/1999 | Surridge |
| 6,133,623 A | * | 10/2000 | Otsuki et al. ................ 257/712 |

FOREIGN PATENT DOCUMENTS

| | | |
|---|---|---|
| JP | 58023462 | 2/1983 |
| JP | 4139752 | 5/1992 |

\* cited by examiner

*Primary Examiner*—Roy Potter

(57) ABSTRACT

An integrated circuit package where the integrated circuit chip is mounted on a conductive slug and electrically coupled to the slug. Besides acting as a heat spreader, the conductive slug may also function as a ground plane. This reduces the need for additional conductive layers and plated through hole connections for forming connections to, for example, ground. As a result, the conductive paths in the internal ground planes are not necessarily cut off by the plated through holes used for interconnecting ground connections thus avoiding some of the electrical performance degradation suffered by prior techniques. In addition, the invention allows more signals to be added and/or the size of the integrated circuit chip to be reduced to enhance electrical performance. It is to be understood that both the foregoing general description and the following detailed description are exemplary, but are not restrictive, of the invention.

19 Claims, 3 Drawing Sheets

INTEGRATED CIRCUIT PACKAGE

FIELD OF THE INVENTION

The present invention relates generally to integrated circuits and, more particularly, to packaging integrated circuits.

BACKGROUND OF THE INVENTION

Conventionally, an integrated circuit package provides for electrical connections from an integrated circuit chip to external conductors, and for protection of the chip from the external environment. Large integrated circuits, for example, Application Specific Integrated Circuits (ASICs) used in telecommunications and other applications may dissipate powers in excess of several watts. Consequently, it may be necessary to provide an integrated circuit package with a heat sink whereby the integrated circuit chip is in thermal contact with a conductive substrate of thermally conductive metal or alloy having an exposed surface for dissipation of heat.

One type of package which is now of significant interest for high lead count integrated circuits, e.g. ASICs for telecommunications applications, is a Ball Grid Array (BGA) package. The terminals take the form of arrays of solder balls. The solder balls are attached by solder reflow to pads on a substrate, which allow for a high density of compact and reliable interconnections. The BGA package body may comprise a polymer, e.g. polyimide, or a ceramic dielectric body. Optionally a BGA package may include a heat spreader, for example, in the form of a heat conductive slug, which is typically copper, or another thermally conductive metal or alloy.

A schematic diagram of a known commercially available ball grid array package for an integrated circuit is shown in FIG. 3. The package 10 for an integrated circuit 12 includes a thermally conductive heat spreader 14, which is typically a layer of metal. The metal is typically thin sheets or a thick slug of a metal such as copper. The integrated circuit 12 is bonded by a thermally conductive die attach adhesive medium 13 to the heat spreader 14.

Bond pads 16 of the integrated circuit are electrically connected via electrically conductive leads 18 to conductive traces defined by electrical conductive layers 16, 20, and 22 within the substrate of the package. The substrate includes dielectric layers 24, 26, and 27 forming a structure similar to that used in printed wiring board technology. The heat spreader 14 is bonded to one side of the substrate. On the opposite side of the substrate there is provided a conductive layer 28 defining conductive traces on which is disposed an array of solder balls 30. Conductive through holes 31 extend through the dielectric layers 24, 26, and 27 forming the substrate to provide for electrical interconnections between the solder balls 30 and the contact pads 16 of the integrated circuit chip. A layer of encapsulatant 32 encloses and protects the integrated circuit chip 12 and the bonding wires 18.

The package is interconnected to the motherboard 38 via ball bonds formed by thermal reflow of the solder balls 30 to form connections to corresponding individual contact pads 36 on the substrate 10. This package has one or more levels of metal interconnections, e.g. 16, 20 and 22, in a cavity down configuration. In this configuration, however, a number of different levels are provided for power, ground, and signal connections. Each additional level in the substrate increases the cost of the package. Thus, it would be desirable to reduce the number of levels.

SUMMARY OF THE INVENTION

The present invention provides an integrated circuit package where the integrated circuit chip is mounted on a conductive slug and electrically coupled to the conductive slug. Besides acting as a heat spreader, the conductive slug may also function as a ground plane. This reduces the need for additional conductive layers and plated through hole connections for forming connections to, for example, ground. As a result, the conductive paths in the internal ground planes are not necessarily cut off by the plated through holes used for interconnecting ground connections thus avoiding some of the electrical performance degradation suffered by prior techniques. In addition, the invention allows more signals to be added and/or the size of the integrated circuit chip to be reduced to enhance electrical performance. It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity. Included in the drawing are the following figures:

FIG. 2c is a schematic diagram of the conductive slug shown in FIG. 2a along line 2a—2a.

DETAILED DESCRIPTION OF THE INVENTION

Figure 1:
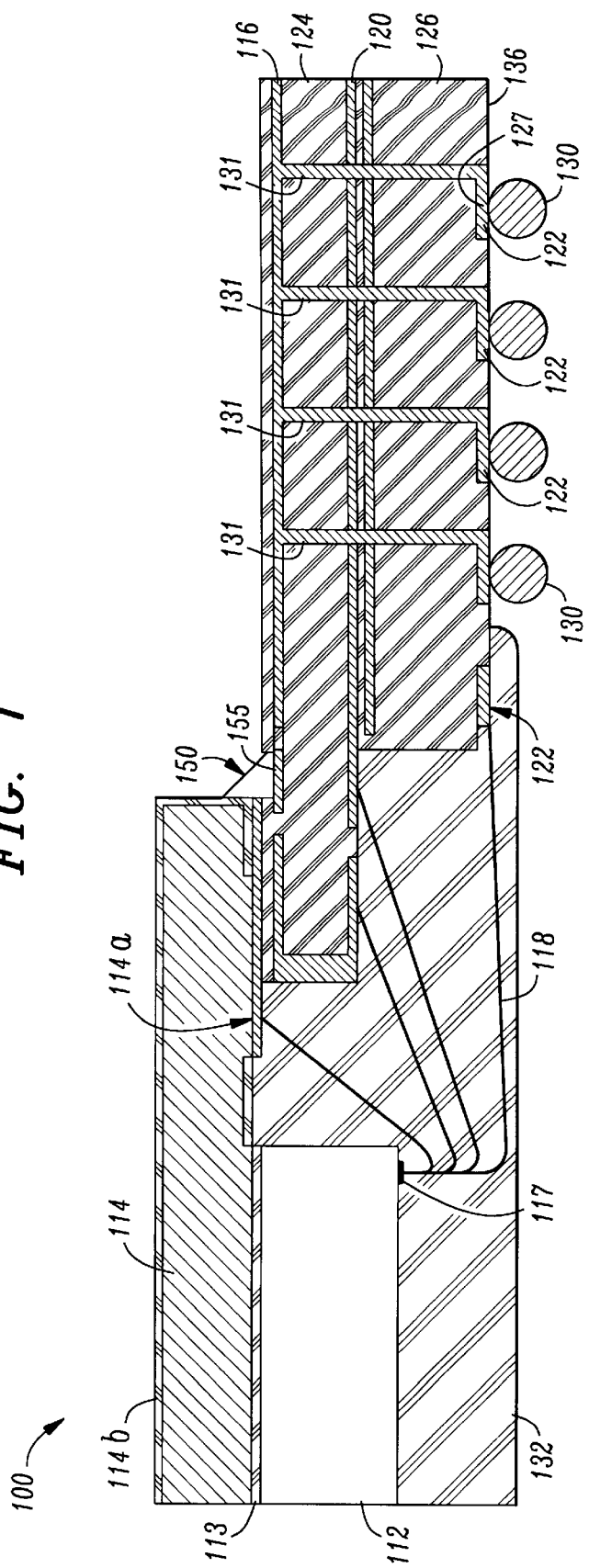
FIG. 1 is a schematic diagram of an integrated circuit mounted in an integrated circuit package according to an illustrative embodiment of the present invention.
Figure 2A:
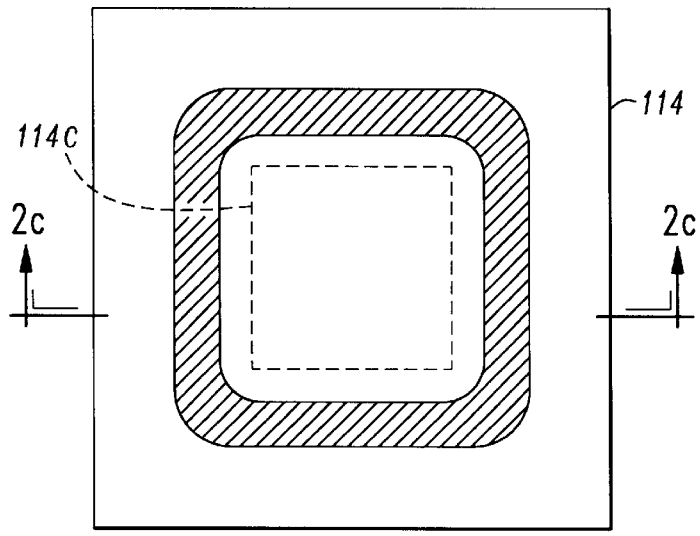
FIGS. 2a and 2b are top views of heat spreading conductive slugs for the integrated circuit package according to an illustrative embodiment of the invention.
Figure 2B:
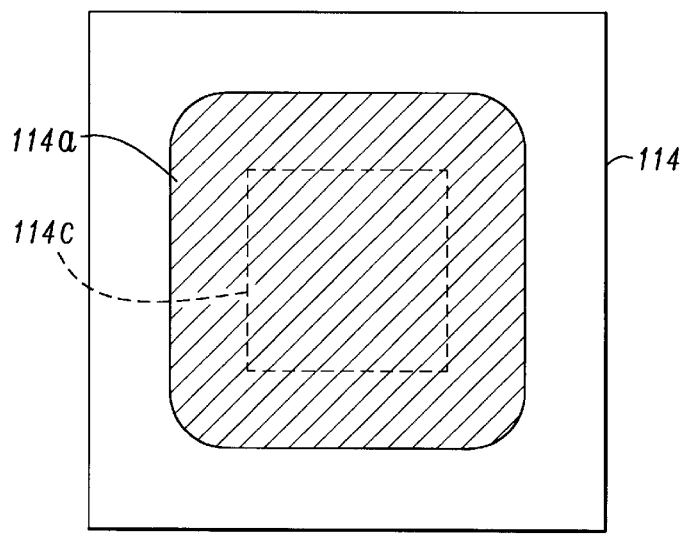
Figure 2C:
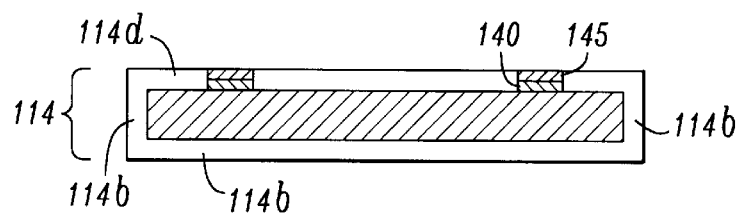
Figure 3:
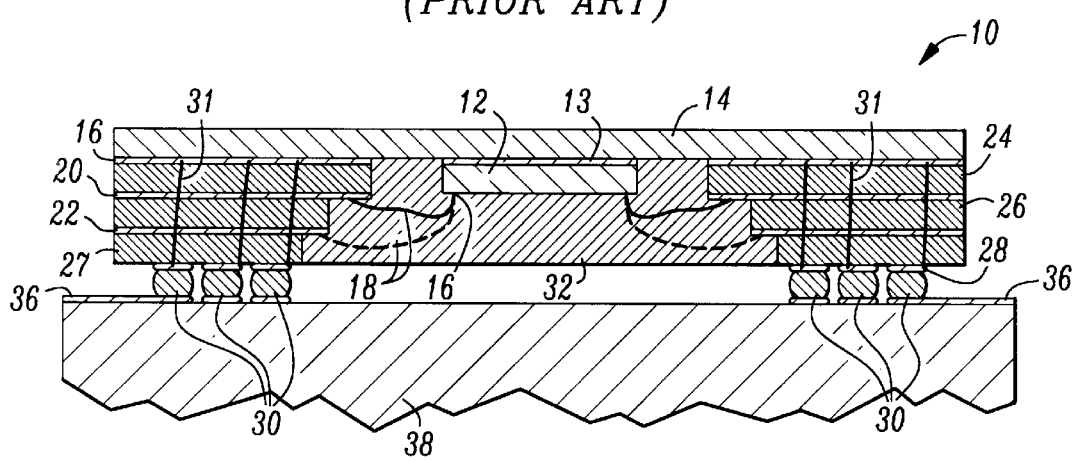
FIG. 3 is a schematic diagram of the integrated circuit chip mounted in the integrated circuit according to the prior art.

Referring now to the drawing, wherein like reference numerals refer to like elements throughout, FIG. 1 is a schematic diagram of an integrated circuit chip mounted in a package according to an illustrative embodiment of the present invention. FIGS. 2a and 2b are top views of a conductive slug 114 according to an exemplary embodiment of the present invention. The package 100 for an integrated circuit chip 112 includes a conductive slug 114 (a conductive body) that may operate as a heat spreader/heat sink and/or an electrically conductive material.

Briefly, the integrated circuit chip 112 may be electrically coupled directly to the conductive slug via wire bonds or other suitable mechanisms. This reduces the need for additional conductive layers and plated through hole connections for forming connections to, for example, ground. As a result, the conductive paths in the internal planes are not necessarily cut off by the plated through holes used for forming interconnecting ground connections; thus, avoiding some of the electrical performance degradation suffered by prior techniques. In addition, the invention allows more signals to be added and/or the size of the integrated circuit chip to be reduced for enhanced electrical performance.

The material for the conductive slug 114 may be selected to have good thermal conductive and/or electrical characteristics. Illustrative materials include metal alloys and metals such as copper. The conductive slug 114 may be formed from one or more sheets (layers) of a metal or metal alloy. The conductive slug may also comprise a thermally conductive material coated with an electrically conducting material. The conductive slug 114 may include a protective coating or outer layer 114b and 114d of reduced conductive or non-conductive material.

Illustratively, if the conductive slug 114 comprises copper, an outer layer 114b and 114d of copper oxide (black oxide) may be formed on the outer surface of the conductive slug 114. Alternatively, the copper oxide 114d may be formed only on the inner surface 114c. In the latter case, the outer layer 114b may be a plated layer of, for example, Ni. In either case, the copper oxide may be used to enhance the bonding integrated circuit chip to the conductive slug 114.

A contact area may be formed by removing a portion of the outer layer 114d to expose the base of conductive slug 114 in contact area 114a. The contact area 114a may be used to provide electrical coupling between the integrated circuit chip 112 and the conductive slug 114. The contact area 114a may be formed on one, two, three, or more sides of area 114c where the integrated circuit chip 112 is to be mounted. The contact area 114a may encircle area 114c as shown in FIG. 2a or include area 114c within its boundaries as shown in FIG. 2b.

The contact area 114a is formed using well-known techniques such as masking the area 114a prior to applying the outer layer 114b. The contact area 114a may include one or more additional layers useful for wire bonding or electrically coupling between the integrated circuit chip 112 and the contact area 114a. These additional layers may include conductive materials such as metals and metal alloys. For example, a layer of nickel 140 may be formed on the contact area 114a followed by a layer of gold 145. Each of these layers may be formed by plating. During plating, the nickel and gold will not adhere to the outer layer 114b. As a result, an additional mask layer is not needed.

The integrated circuit chip 112 may be bonded to the conductive slug at area 114c using a thermally conductive die attach adhesive medium 113. The conductive slug 114 is bonded to one side of the substrate. The substrate includes dielectric layers 124 and 126. The material for bonding the conductive slug 114 to the substrate may include adhesives, solder, or other mechanical means that may provide electrical coupling between the conductive slug and one or more of the conductive layers. In the illustrative embodiment, the conductive slug is attached using solder 150. In this case, the solder 150 adheres to the conductive slug 114 and a segment 155 of conductive layer 116.

The conductive slug 114 may be bonded to the substrate to allow electrical coupling between the conductive slug 114 and one or more of the solder balls 130 via the plated through holes. In the illustrative embodiment, the solder 150 forms an electrical connection between the conductive slug 114 and the segment 155. In turn, segment 155 is coupled to one or more solder balls 130 via the conductive layer 116 and one or more of the plated through holes 131.

The bond pads 117 of the integrated circuit chip are electrically connected via electrically conductive wires 118 to the different conductive layers 116, 120, and 122 within the substrate of the package. The conductive layers may be used for power, ground, and signal interconnections. Further, the number of conductive layers may be increased or decreased to accommodate the number of interconnections to be formed between the integrated circuit chip and the package.

The electrically conductive wires 118 are also bonded to the conductive slug 114 providing electrical coupling between the conductive slug 114 and the solder balls 130 via the plated through 131. This reduces the need for additional conductive layers and for additional plated through hole connections from conductive layer to conductive layer. As a result, the conductive paths in the internal ground planes are not necessarily cut off by the plated through holes thus avoiding some of the electrical performance degradation suffered by prior techniques. In addition, the invention allows more signals to be added and/or the size of the integrated circuit chip to be reduced to enhance electrical performance.

On the opposite side of the substrate there is provided a conductive layer 116 defining conductive traces on which is disposed an array of the solder balls 130. Also provided is a solder mask 136. As described above, conductive through holes 131 extend through the dielectric layers 124 and 126 forming the substrate to provide electrical interconnections between the solder balls 130 and the conductive layer 116. An epoxy encapsulant 132 encloses and protects the integrated circuit chip 112 and the bonding wires 118.

The package may be subsequently interconnected to a motherboard via ball bonds formed by thermal reflow of the solder balls 130 to form connections to corresponding individual contact pads on the motherboard. The motherboard is, for example, a printed circuit board.

Although the invention has been described with reference to exemplary embodiments, it is not limited to those embodiments. Rather, the appended claims should be construed to include other variants and embodiments of the invention that may be made by those skilled in the art without departing from the true spirit and scope of the present invention.

What is claimed:

1. An integrated circuit package comprising:
   a conductive slug;
   a layer formed on the outer surfaces of the conductive slug, the layer having a first segment comprising a first material and a second segment comprising a second material different from the first material;
   an integrated circuit chip having a footprint on the first material; and
   an electrically conductive element extending from the integrated circuit chip to the conductive slug and contacting the second material to connect the integrated circuit chip to ground.

2. The integrated circuit package of claim 1 further comprising a substrate package coupled to the conductive slug.

3. The integrated circuit package of claim 2 wherein the substrate package includes at least a first conductive layer where the integrated circuit chip is electrically coupled to the first conductive layer.

4. The integrated circuit package of claim 3 wherein the substrate package includes a second conductive layer where the conductive slug is electrically coupled to the second conductive layer.

5. The integrated circuit package of claim 4 wherein the first conductive layer is electrically isolated from the second conductive layer in the substrate package.

6. The integrated circuit package of claim 4 wherein the substrate package includes at least three conductive layers and the integrated circuit chip is electrically coupled to the third conductive layer.

7. The integrated circuit package of claim 2 wherein the substrate package is configured to be mounted on a motherboard.

8. The integrated circuit package of claim 7 wherein the substrate is a circuit board.

9. The integrated circuit package of claim 2 wherein the substrate package has plated through holes and the conductive slug is electrically coupled to at least one of the through holes.

10. The integrated circuit package of claim 1 wherein the integrated circuit chip is both mechanically and electrically coupled to the conductive slug.

11. The integrated circuit package of claim 1 wherein the conductive slug forms a heat sink.

12. The integrated circuit package recited in claim 1 wherein the second material comprises one or more conductive layers selected from the group consisting of nickel, gold and alloys thereof.

13. An integrated circuit package comprising:

a conductive slug;

a layer formed on the outer surfaces of the conductive slug, the layer having a first segment comprising a first material and a second segment comprising a second material different from the first material;

an integrated circuit chip having a footprint on the first material;

a substrate package having a plurality of conductive layers, at least one of the plurality of conductive layers electrically coupled to the integrated circuit chip; and an electrically conductive element extending from the integrated circuit chip to the conductive slug and contacting the second material to connect the integrated circuit chip to ground.

14. The integrated circuit package of claim 13 wherein the substrate package is configured to be mounted on a motherboard.

15. The integrated circuit package of claim 14 wherein the substrate is a circuit board.

16. The integrated circuit package of claim 13 wherein the substrate package has through holes and the conductive slug is electrically coupled to at least one of the plated through holes.

17. The integrated circuit package of claim 13 wherein the integrated circuit chip is both mechanically and electrically coupled to the conductive slug.

18. The integrated circuit package of claim 13 wherein the conductive slug forms a heat sink.

19. The integrated circuit package recited in claim 13 wherein the second material comprises one or more conductive layers selected from the group consisting of nickel, gold and alloys thereof.

* * * * *